(12) United States Patent
Liu (10) Patent No.: US 10,943,984 B2
(45) Date of Patent: Mar. 9, 2021

(54) THIN FILM TRANSISTOR AND MANUFACTURING METHOD THEREOF, DISPLAY SUBSTRATE AND MANUFACTURING METHOD THEREOF, AND DISPLAY DEVICE

(71) Applicant: BOE Technology Group Co., Ltd., Beijing (CN)

(72) Inventor: Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 12 days.

(21) Appl. No.: 16/326,257

(22) PCT Filed: Apr. 18, 2018

(86) PCT No.: PCT/CN2018/083535
§ 371 (c)(1),
(2) Date: Feb. 18, 2019

(87) PCT Pub. No.: WO2019/041829
PCT Pub. Date: Mar. 7, 2019

(65) Prior Publication Data
US 2020/0203494 A1    Jun. 25, 2020

(30) Foreign Application Priority Data

Aug. 31, 2017    (CN) .......................... 201710778593.8

(51) Int. Cl.
*H01L 29/423* (2006.01)
*H01L 27/32* (2006.01)
(Continued)

(52) U.S. Cl.
CPC .... *H01L 29/42376* (2013.01); *H01L 27/3246* (2013.01); *H01L 27/3248* (2013.01);
(Continued)

(58) Field of Classification Search
CPC ........................ H01L 29/4908; H01L 27/3248
See application file for complete search history.

(56) References Cited

U.S. PATENT DOCUMENTS

| | | |
|---|---|---|
| 6,909,114 B1 | 6/2005 | Yamazaki |
| 7,172,928 B2 | 2/2007 | Yamazaki |
| | (Continued) | |

FOREIGN PATENT DOCUMENTS

| | | |
|---|---|---|
| CN | 1614782 A | 5/2005 |
| CN | 103413783 A | 11/2013 |
| | (Continued) | |

OTHER PUBLICATIONS

International Search Report and Written Opinion (including English translation of Search Report and Box V of Written Opinion) for International Application No. PCT/CN2018/083535, dated Jul. 10, 2018, 13 pages.

*Primary Examiner* — Jay C Chang
*Assistant Examiner* — Mikka Liu
(74) *Attorney, Agent, or Firm* — Westman, Champlin & Koehler, P.A.

(57) ABSTRACT

The present disclosure provides a thin film transistor and a manufacturing method thereof, a display substrate and a manufacturing method thereof, and a display device. The thin film transistor of the embodiments of the present disclosure comprises an active layer pattern disposed on a base substrate, a gate electrode insulating pattern disposed on the active layer pattern, and a gate electrode disposed on the gate electrode insulating pattern, wherein a conductive pattern is disposed between the gate electrode and the gate electrode insulating pattern, the conductive pattern being electrically connected to the gate electrode, and an orthographic projection of the conductive pattern on the base
(Continued)

substrate being overlapped with an orthographic projection of the gate electrode insulating pattern on the base substrate.

18 Claims, 6 Drawing Sheets

(51) Int. Cl.
  *H01L 29/49* (2006.01)
  *H01L 29/66* (2006.01)
(52) U.S. Cl.
  CPC .... *H01L 29/42384* (2013.01); *H01L 29/4908* (2013.01); *H01L 29/66742* (2013.01); *H01L 2227/323* (2013.01)

(56) References Cited

U.S. PATENT DOCUMENTS

| | | | |
|---|---|---|---|
| 7,439,543 B2 | 10/2008 | Yamazaki | |
| 8,049,275 B2 | 11/2011 | Yamazaki | |
| 8,680,532 B2 | 3/2014 | Yamazaki | |
| 8,957,422 B2 | 2/2015 | Yamazaki | |
| 9,496,294 B2 | 11/2016 | Shen | |
| 9,627,460 B2 | 4/2017 | Yamazaki | |
| 2005/0110016 A1* | 5/2005 | Yamazaki | H01L 27/1214 257/66 |
| 2005/0275038 A1* | 12/2005 | Shih | H01L 29/78633 257/382 |
| 2012/0292610 A1* | 11/2012 | Wang | H01L 27/1259 257/43 |
| 2013/0026475 A1* | 1/2013 | Choi | H01L 29/4908 257/59 |
| 2013/0056735 A1* | 3/2013 | Heo | H01L 51/5246 257/59 |
| 2015/0155430 A1* | 6/2015 | Li | H01L 33/24 257/13 |
| 2017/0243943 A1 | 8/2017 | Won et al. | |

FOREIGN PATENT DOCUMENTS

| | | |
|---|---|---|
| CN | 107579003 A | 1/2018 |
| KR | 10-0667090 B1 | 1/2007 |

* cited by examiner

THIN FILM TRANSISTOR AND MANUFACTURING METHOD THEREOF, DISPLAY SUBSTRATE AND MANUFACTURING METHOD THEREOF, AND DISPLAY DEVICE

CROSS REFERENCE TO RELATED APPLICATION

The present application is a Section 371 National Stage application of International Application No. PCT/CN2018/083535, filed on 18 Apr. 2018, which claims priority to Chinese Patent Application No. 201710778593.8, filed on Aug. 31, 2017, with a title of "Thin film transistor and manufacturing method thereof, display substrate and manufacturing method thereof, and display device", the contents of which are incorporated herein by reference in their entireties.

TECHNICAL FIELD

The present disclosure relates to the technical field of display device, and particularly to a thin film transistor and a manufacturing method thereof, a display substrate and a manufacturing method thereof, and a display device.

BACKGROUND

Top gate type thin film transistors (TFTs) are widely used in display devices due to relatively low parasitic capacitance and relatively good electrical properties.

SUMMARY

Embodiments of the present disclosure provide a thin film transistor and a manufacturing method thereof, a display substrate and a manufacturing method thereof, and a display device.

In one aspect, the embodiments of the present disclosure provide a thin film transistor, comprising an active layer pattern disposed on a base substrate, a gate electrode insulating pattern disposed on the active layer pattern, and a gate electrode disposed on the gate electrode insulating pattern, wherein a conductive pattern is disposed between the gate electrode and the gate electrode insulating pattern, the conductive pattern being electrically connected to the gate electrode, and an orthographic projection of the conductive pattern on the base substrate being overlapped with an orthographic projection of the gate electrode insulating pattern on the base substrate.

Optionally, an orthographic projection of the gate electrode on the base substrate is not completely overlapped with the orthographic projection of the conductive pattern on the base substrate (the orthographic projection of the gate electrode on the base substrate is within the orthographic projection of the conductive pattern on the base substrate).

Optionally, the conductive pattern comprises a non-metallic conductive material.

Optionally, the conductive pattern comprises a graphene material or carbon nanotubes.

Optionally, a buffer layer is further disposed between the base substrate and the active layer pattern.

Optionally, the thin film transistor further comprises an interlayer dielectric layer overlaying the gate electrode, and a source electrode and a drain electrode disposed on the interlay dielectric layer, wherein the source electrode and the drain electrode are electrically connected to the active layer pattern through via holes respectively.

In another aspect, the embodiments of the present disclosure provide a display substrate comprising any thin film transistor described above.

Optionally, the display substrate further comprises a pixel electrode, wherein the pixel electrode is disposed in the same layer and made from the same material as the conductive pattern, and the pixel electrode is electrically connected to the drain electrode of the thin film transistor.

Optionally, the display substrate further comprises a first insulating pattern disposed in the same layer as the gate electrode insulating pattern.

Optionally, the display substrate further comprises a color film disposed between the first insulating pattern and the pixel electrode.

Optionally, the display substrate further comprises an etching-blocking and retaining pattern, wherein the etching-blocking and retaining pattern is disposed in the same layer and made from the same material as the gate electrode.

Optionally, the display substrate further comprises a passivating layer overlaying the thin film transistor and a pixel definition layer disposed on the passivating layer.

In yet another aspect, the embodiments of the present disclosure provide a display device comprising any display substrate described above.

In still another aspect, the embodiments of the present disclosure provide a manufacturing method of a thin film transistor, comprising:

forming an active layer pattern on a base substrate; and forming a gate electrode insulating pattern, a conductive pattern and a gate electrode, which are sequentially arranged in lamination, on a side of the base substrate on which the active layer pattern is formed, wherein an orthographic projection of the conductive pattern on the base substrate is overlapped with an orthographic projection of the gate electrode insulating pattern on the base substrate, and the gate electrode is disposed on the conductive pattern and is electrically connected to the conductive pattern.

Optionally, said forming the gate electrode insulating pattern, the conductive pattern and the gate electrode, which are sequentially arranged in lamination, comprising:

fabricating an insulating film, a first conductive film and a second conductive film sequentially on a side of the base substrate on which the active layer pattern is formed;

etching the second conductive film by a wet etching process to form the gate electrode; and etching the insulating film and the first conductive film by a dry etching process to form the gate electrode insulating pattern and the conductive pattern.

Optionally, before forming the active layer pattern, the method further comprises:

forming a buffer layer on the base substrate.

Optionally, after forming the gate electrode, the method further comprises:

forming an interlayer dielectric layer overlaying the gate electrode; and forming a source electrode and a drain electrode on the interlayer dielectric layer, the source electrode and the drain electrode being electrically connected to the active layer pattern through via holes respectively.

In still another aspect, the embodiments of the present disclosure provide a manufacturing method of a display substrate, comprising:

forming a semiconductor layer on a base substrate, the semiconductor layer comprising an active layer pattern; and forming an insulating layer, a first conductive layer and a second conductive layer, which are sequentially arranged in lamination, on a side of the base substrate on which the semiconductor layer is formed, wherein the insulating layer comprises a gate electrode insulating pattern and a first insulating pattern, the first conductive layer comprises a conductive pattern and a pixel electrode, and the second conductive layer comprises a gate electrode and an etching-blocking and retaining pattern; wherein an orthographic projection of the conductive pattern on the base substrate is overlapped with an orthographic projection of the gate electrode insulating pattern on the base substrate, and the gate electrode is disposed on the conductive pattern and is electrically connected to the conductive pattern.

Optionally, after forming the second conductive layer, the method further comprises:

forming an interlayer dielectric layer overlaying the second conductive layer;

forming a source electrode and a drain electrode on the interlayer dielectric layer;

forming a passivating layer overlaying the source electrode and the drain electrode; and forming a pixel definition layer on the passivating layer.

BRIEF DESCRIPTION OF DRAWINGS

To more clearly illustrate the technical solutions in the embodiments of the present disclosure or in related art, the drawings to be used in the description of the embodiments or related art will be briefly introduced below. Obviously, the drawings described are only some embodiments of the present disclosure, and for those skilled in the art, other drawings can be obtained according to these drawings without inventive efforts.

DETAILED DESCRIPTION

Figure 1:
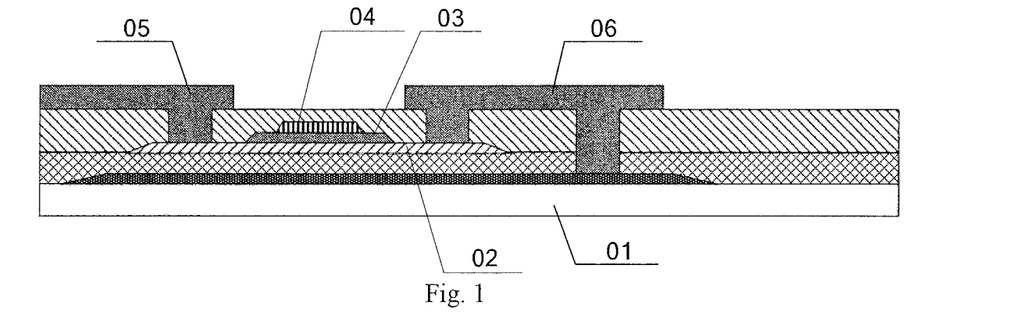
FIG. 1 is a schematic sectional structure diagram of a top gate TFT provided in the related art.

FIG. 1 shows a top gate TFT in the related art, which comprises an active layer pattern 02 formed on a base substrate 01, a gate electrode insulating pattern 03 formed on the active layer pattern 02, a gate electrode 04 formed on the gate electrode insulating pattern 03, and a source electrode 05 and a drain electrode 06 connected to the active layer pattern 02 through via holes. When manufacturing a top gate TFT, it requires applying a self-aligning process to the gate electrode 04 and the gate electrode insulating pattern 03. Usually, the gate electrode 04 is manufactured by a wet etching process, and the gate electrode insulating pattern 03 is manufactured by a dry etching process. When forming the gate electrode 04 by a wet etching process, the etching solution will etch a little distance more below the photoresist, such that the gate electrode 04 is shorter than the gate electrode insulating pattern 03 by a little distance, that is, an orthographic projection of the gate electrode 04 on the base substrate 01 cannot be completely overlapped with an orthographic projection of the gate electrode insulating pattern 03 on the base substrate 01. Due to the little distance absence of the gate electrode 04, the active layer pattern 02 under the gate electrode insulating pattern 03 without being overlaid by the gate electrode 04 is not modulated by the gate electrode 04, which leads to insufficient start current of the top gate TFT, thereby influencing the electrical properties of the top gate TFT, and consequently the display effect of the display device.

Figure 2:
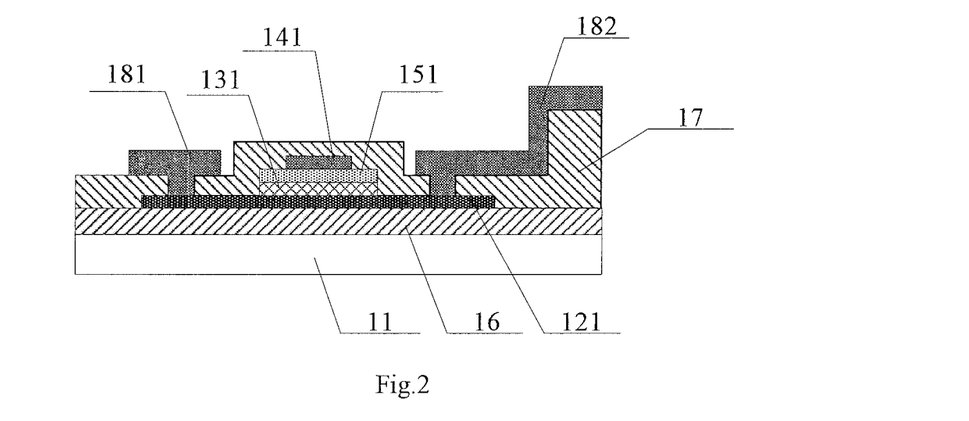
FIG. 2 is a schematic sectional structure diagram of a top gate TFT provided in an embodiment of the present disclosure.

The embodiments of the present disclosure provide a thin film transistor, as shown in FIG. 2, comprising an active layer pattern 121 disposed on a base substrate 11, a gate electrode insulating pattern 131 disposed on the active layer pattern 121, and a gate electrode 141 disposed on the gate electrode insulating pattern 131; and further, a conductive pattern 151 disposed between the gate electrode 141 and the gate electrode insulating pattern 131, wherein the conductive pattern 151 is electrically connected to the gate electrode 141, and an orthographic projection of the conductive pattern 151 on the base substrate 11 is overlapped with an orthographic projection of the gate electrode insulating pattern 131 on the base substrate 11.

The thin film transistor described above is a top gate TFT. The TFT may be an oxide TFT or a polysilicon TFT, and this is not limited in the embodiments of the present disclosure. When manufacturing a large size and high resolution active matrix organic light emitting diode (AMOLED) display device, the oxide TFT is preferentially used due to its relatively low parasitic capacitance and relatively good electrical properties. Of course, the oxide TFT may also be used in other display devices.

Figure 7:
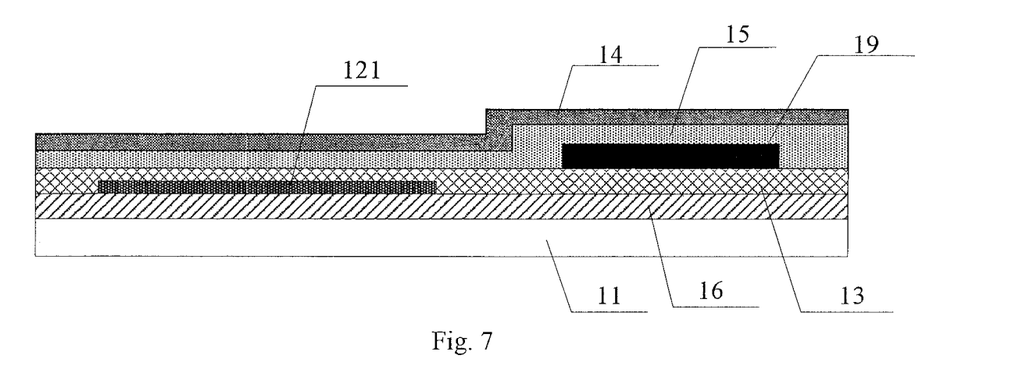
FIG. 7 is a schematic sectional structure diagram V of a display substrate provided in an embodiment of the present disclosure.
Figure 8:
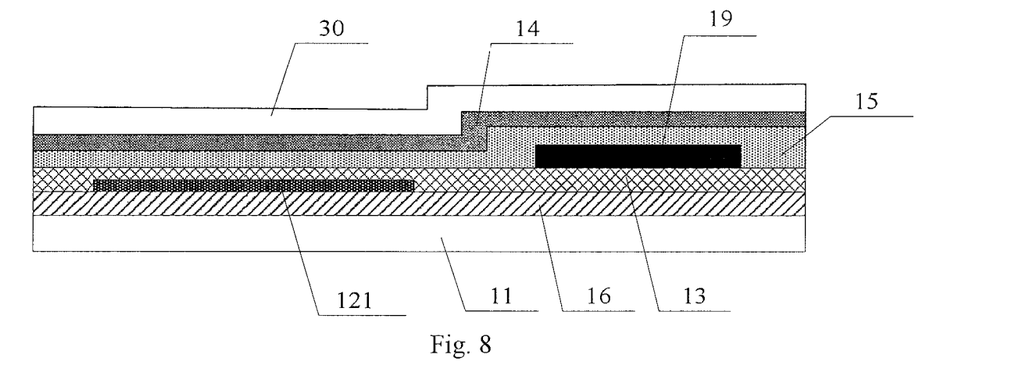
FIG. 8 is a schematic sectional structure diagram VI of a display substrate provided in an embodiment of the present disclosure.
Figure 9:
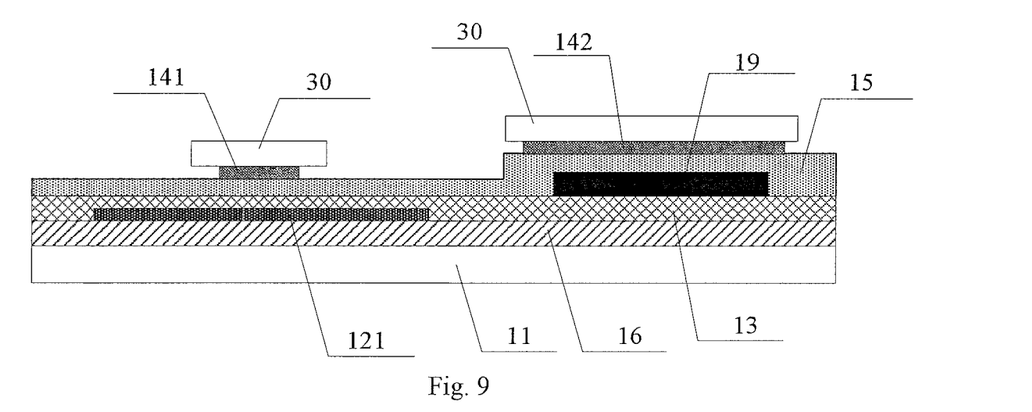
FIG. 9 is a schematic sectional structure diagram VII of a display substrate provided in an embodiment of the present disclosure.
Figure 10:
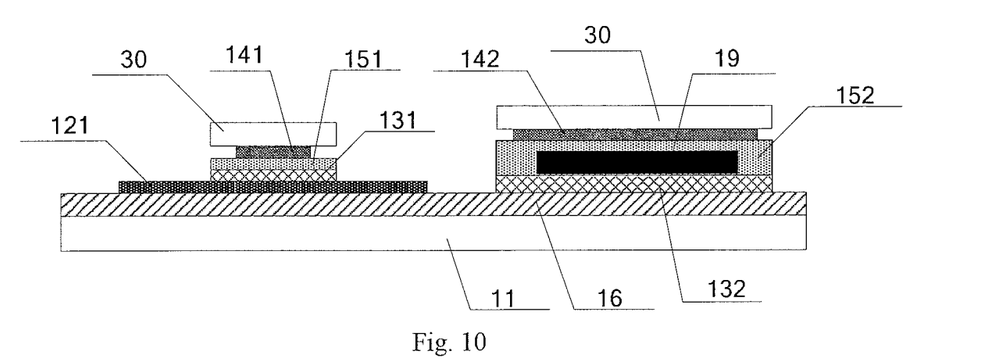
FIG. 10 is a schematic sectional structure diagram VIII of a display substrate provided in an embodiment of the present disclosure.

With reference to FIG. 2, FIG. 5, and FIG. 7 to FIG. 11, in practical manufacture, an insulating film 13, a first conductive film 15 and a second conductive film 14 may be fabricated sequentially on the base substrate 11 formed with the active layer pattern 121, as shown in FIG. 7; then a photoresist 30 is applied (as shown in FIG. 8), exposed and developed, and the second conductive film 14 is etched by a wet etching process to form the gate electrode 141, as shown in FIG. 9; subsequently, the insulating film 13 and the first conductive film 15 are etched by a dry etching process to form the gate electrode insulating pattern 131 and the conductive pattern 151, as shown in FIG. 10; and finally, the photoresist 30 on the gate electrode 141 is stripped off. Since both the conductive pattern 151 and the gate electrode insulating pattern 131 are formed by etching with a dry etching process, it can be ensured that an orthographic projection of the conductive pattern 151 on the base substrate 11 is overlapped with an orthographic projection of the gate electrode insulating pattern 131 on the base substrate 11.

As compared to the related art as shown in FIG. 1, the thin film transistor provided in the embodiments of the present disclosure comprises a conductive pattern disposed between the gate electrode and the gate electrode insulating pattern. In this way, since the gate electrode can be firstly formed by etching with a wet etching process, and then the conductive pattern and the gate electrode insulating pattern can be formed by etching with a dry etching process, it can be ensured that the orthographic projection of the conductive pattern on the base substrate is overlapped with the orthographic projection of the gate electrode insulating pattern on the base substrate, that is, the conductive pattern is present everywhere on the surface of the gate electrode insulating pattern. The conductive pattern makes up for the defect of lacking gate electrode in a little distance on the edges of the gate electrode insulating pattern in the related art, such that the corresponding active layer pattern under the whole gate electrode insulating pattern can be modulated, which enhances the electrical properties of the thin film transistor, thereby improving the display effect of the display device.

Further, the conductive pattern 151 may be composed of a non-metallic conductive material. In this way, it can prevent the influence on the conductive pattern 151 caused by the etching solution when etching the gate electrode metal by a wet etching process. Since both the graphene material and the carbon nanotube network have relatively good conductivity, in one embodiment, the conductive pattern 151 comprises a graphene material or a carbon nanotube network in one embodiment.

As shown in FIG. 2, a buffer layer 16 is further provided between the base substrate 11 and the active layer pattern 121; and the thin film transistor further comprises an interlayer dielectric layer 17 overlaying the gate electrode 141, and a source electrode 181 and a drain electrode 182 disposed on the interlayer dielectric layer 17, wherein the source electrode 181 and the drain electrode 182 are connected to the active layer pattern 121 through via holes respectively. Here, the buffer layer 16 is typically an inorganic film composed of a SiOx material, which is used for isolating the base substrate 11 to prevent impurity ions in the base substrate 11 from diffusing into the upper layer structure. The interlayer dielectric layer 17 is also referred to as an insulating layer, typically composed of an insulating material, which is used for separating two adjacent conductive layers.

Another embodiment of the present disclosure provides a display substrate comprising the above thin film transistor. The display substrate may be an ordinary array substrate, i.e., an array substrate without color film, or a COA (color-filter on array) substrate, and this is not limited in the embodiments of the present disclosure. By disposing a conductive pattern between gate electrode and gate electrode insulating pattern in the thin film transistor of the embodiments of the present disclosure, the defect of lacking the gate electrode in a little distance on the edges of the gate electrode insulating pattern in the related art is remedied, such that the corresponding active layer pattern under the whole gate electrode insulating pattern can be modulated, which enhances the electrical properties of the thin film transistor, thereby improving the display effect of the display device.

Figure 3:
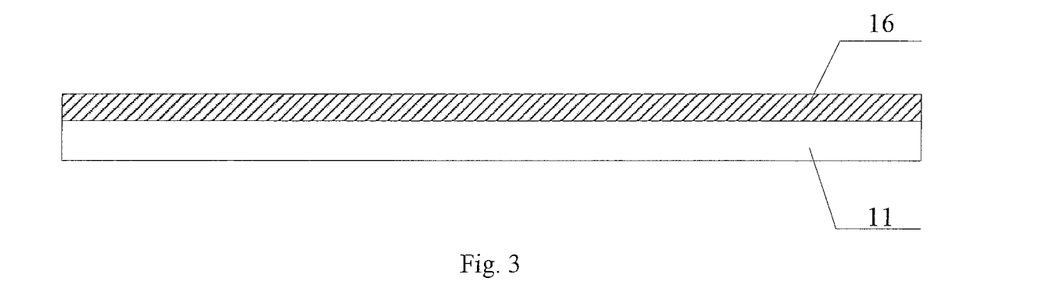
FIG. 3 is a schematic sectional structure diagram I of a display substrate provided in an embodiment of the present disclosure.
Figure 4:
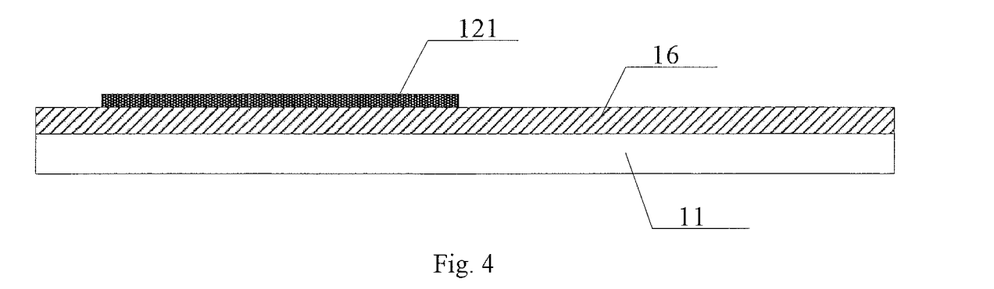
FIG. 4 is a schematic sectional structure diagram II of a display substrate provided in an embodiment of the present disclosure.

In practical manufacture, the buffer layer 16 and the active layer pattern 121 may be fabricated sequentially on the base substrate 11, as shown in FIG. 3 to FIG. 4.

Optionally, with reference to FIG. 5 to FIG. 11, an insulating film 13, a color film 19, a first conductive film 15 and a second conductive film 14 may be fabricated sequentially on a base substrate 11 formed with an active layer pattern 121, as shown in FIG. 7; then a photoresist 30 is applied, exposed and developed, and the second conductive film 14 is etched by a wet etching process to form a gate electrode 141 and an etching-blocking and retaining pattern 142, as shown in FIG. 9; subsequently, the insulating film 13 and the first conductive film 15 are etched by a dry etching process to form a gate electrode insulating pattern 131 and a conductive pattern 151, as well as a first insulating pattern 132 and a pixel electrode 152, as shown in FIG. 10; and finally, the photoresist 30 is stripped off. Since both the conductive pattern 151 and the gate electrode insulating pattern 131 are formed by etching with a dry etching process, it can be ensured that an orthographic projection of the conductive pattern 151 on the base substrate 11 is overlapped with an orthographic projection of the gate electrode insulating pattern 131 on the base substrate 11.

As shown in FIG. 10, the display substrate comprises a first insulating pattern 132, and the first insulating pattern 132 is disposed in the same layer as the gate electrode insulating pattern 131.

Since the first insulating pattern 132 and the gate electrode insulating pattern 131 are disposed in the same layer, they can be fabricated by one patterning process, which simplifies the manufacture process and thus saves the manufacture cost.

In addition, the display substrate further comprises a pixel electrode 152 and the pixel electrode 152 is disposed in the same layer and made from the same material as the conductive pattern 151.

Since the pixel electrode 152 and the conductive pattern 151 are disposed in the same layer and made from the same material, they can be fabricated by one patterning process, which simplifies the manufacture process and thus saves the manufacture cost. Because graphene material and carbon nanotube network have relatively good conductivity and transmittance, in one embodiment, both the pixel electrode 152 and the conductive pattern 151 comprise a graphene material or a carbon nanotube network.

By taking AMOLED display substrate as an example, the display substrate may comprise a plurality of organic light-emitting diode (OLED) devices, and the plurality of OLED devices may be arranged as an array. If the plurality of OLED devices have a common cathode (that is, the cathodes of the plurality of OLED devices are connected to form a whole surface electrode), the pixel electrode 152 is the anode of the OLED device; and if the plurality of OLED devices have a common anode (that is, the anodes of the plurality of OLED devices are connected to form a whole surface electrode), the pixel electrode 152 is the cathode of the OLED device.

Figure 11:
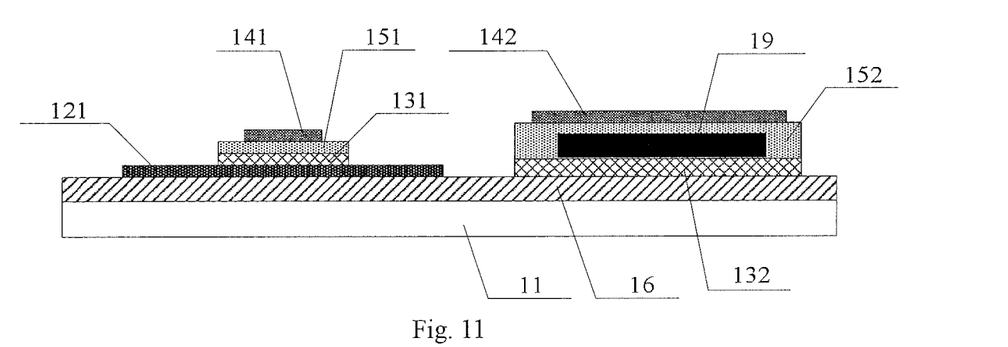
FIG. 11 is a schematic sectional structure diagram IX of a display substrate provided in an embodiment of the present disclosure.

FIGS. 10 and 11 show the case where the color film 19 is disposed between the first insulating pattern 132 and the pixel electrode 152. It should be noted that, in practical application, the color film 19 is not needed when the light emitting layer in the display substrate comprises three kinds of OLED sub-pixels for emitting lights with different colors. When the display substrate employs a white OLED (WOLED) device, it is needed to fabricate the color film 19. However, the color film 19 may be disposed below the pixel electrode 152 (i.e., in a bottom emitting structure, as shown in FIG. 11) or above the light emitting layer (i.e., in a top emitting structure), or arranged on an aligned substrate aligned with the display substrate. This is not limited in the embodiments of the present disclosure. For the convenience of describing, the embodiments of the present disclosure illustrate the color film 19 disposed below the pixel electrode 152 (i.e., in a bottom emitting structure) as an example.

Further, as shown in FIG. 12 to FIG. 15, the display substrate further comprises an etching-blocking and retaining pattern 142 disposed on the pixel electrode 152; and the etching-blocking and retaining pattern 142 is disposed in the same layer and made from the same material as the gate electrode 141. By disposing the etching-blocking and retaining pattern 142, the influence on the pixel electrode 152 when etching the interlayer dielectric layer 17 can be prevented. Meanwhile, since the etching-blocking and retaining pattern 142 and the gate electrode 141 are disposed in the same layer and made from the same material, they can be fabricated by one patterning process, which can simplify the manufacture process and thus save the manufacture cost.

As shown in FIG. 13 to FIG. 17, the display substrate further comprises a passivating layer 20 overlaying the thin film transistor and a pixel definition layer 21 disposed on the passivating layer 20.

Figure 13:
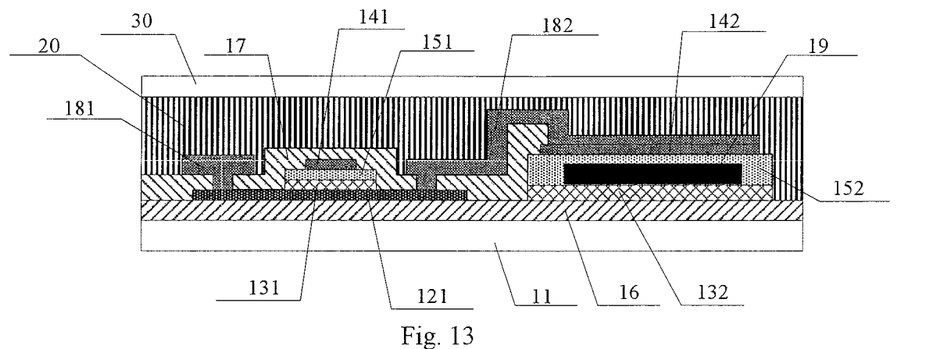
FIG. 13 is a schematic sectional structure diagram XI of a display substrate provided in an embodiment of the present disclosure.
Figure 14:
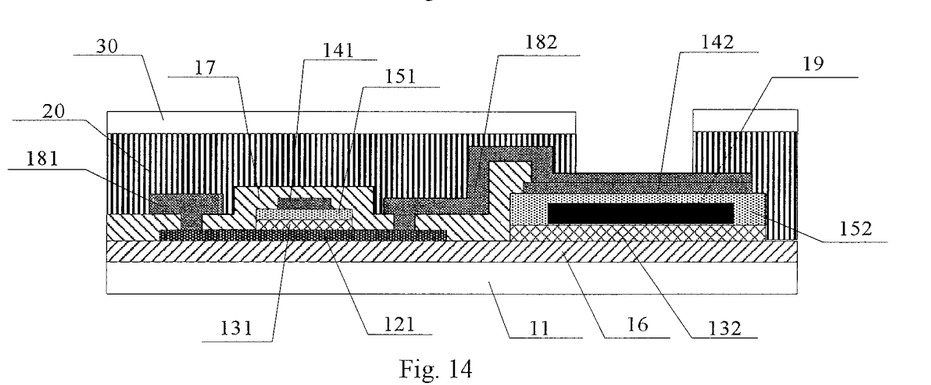
FIG. 14 is a schematic sectional structure diagram XII of a display substrate provided in an embodiment of the present disclosure.
Figure 15:
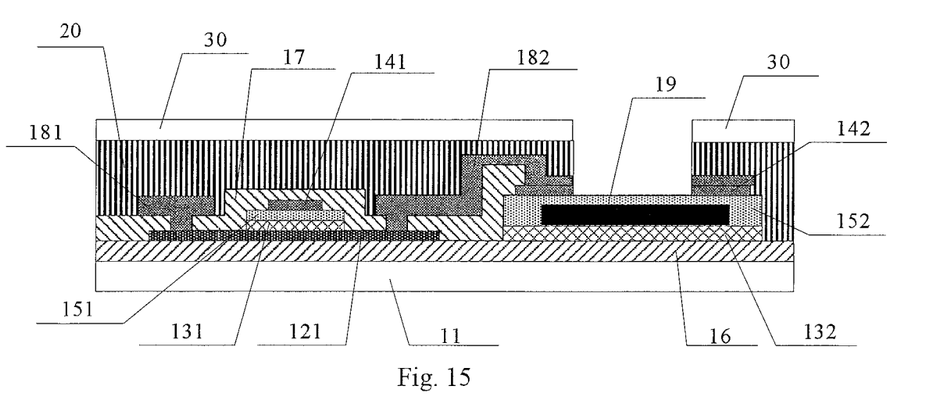
FIG. 15 is a schematic sectional structure diagram XIII of a display substrate provided in an embodiment of the present disclosure.
Figure 17:
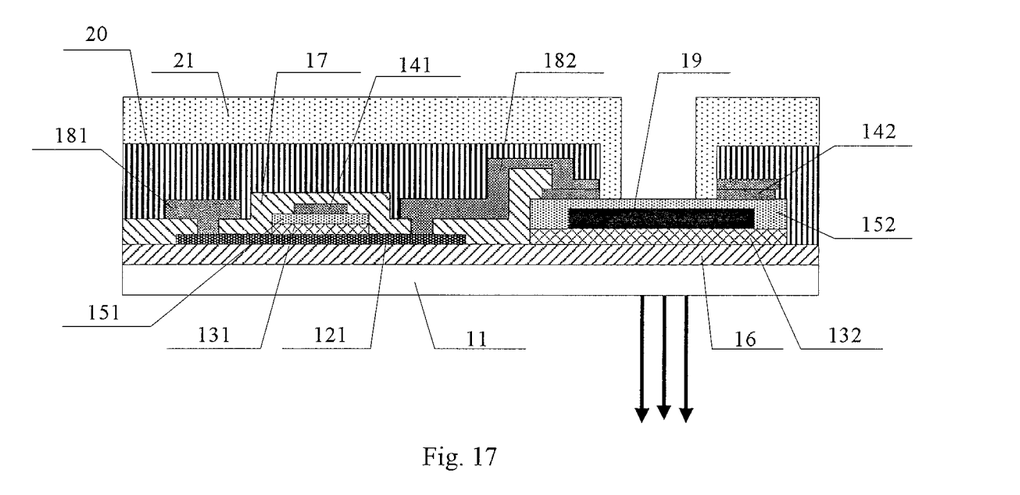
FIG. 17 is a schematic sectional structure diagram XV of a display substrate provided in an embodiment of the present disclosure.

When patterning the passivating layer 20, a photoresist 30 is firstly applied, as shown in FIG. 13; then the photoresist is exposed and developed, and subsequently, the passivating layer 20 is etched by a dry etching process, as shown in FIG. 14; and then the etching-blocking and retaining pattern 142 is etched by a wet etching process to expose the pixel electrode 152, as shown in FIG. 15. The drain electrode 182 is electrically connected to the pixel electrode 152 via the etching-blocking and retaining pattern 142 on the edge of the pixel electrode 152. Finally, the pixel definition layer 21 is fabricated on the passivating layer 20, as shown in FIG. 17.

Another embodiment of the present disclosure provides a manufacturing method of a thin film transistor, comprising the following steps.

Step 101: forming an active layer pattern 121 on a base substrate 11, as shown in FIG. 4.

In practical manufacture, a semiconductor film may be firstly fabricated on a base substrate 11, and then the semiconductor film is subjected to one patterning process to form an active layer pattern 121.

Step 102: forming a gate electrode insulating pattern 131, a conductive pattern 151 and a gate electrode 141, which are sequentially arranged in lamination, on the base substrate 11 containing formed with the active layer pattern 121, wherein; an orthographic projection of the conductive pattern 151 on the base substrate 11 being is overlapped with an orthographic projection of the gate electrode insulating pattern 131 on the base substrate 11; the gate electrode 141 being is disposed on the conductive pattern 151 and being is electrically connected to the conductive pattern 151.

Figure 5:
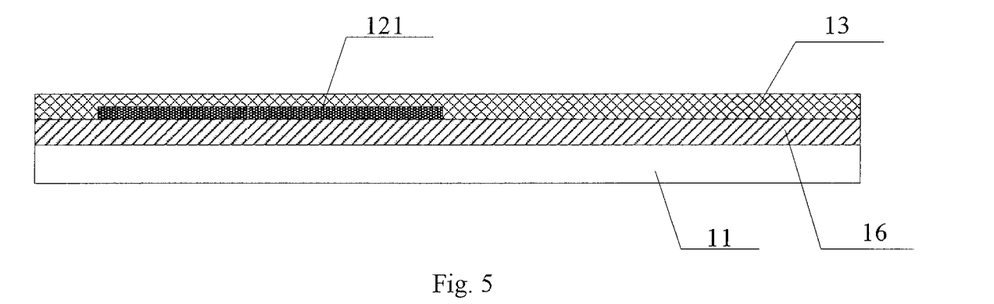
FIG. 5 is a schematic sectional structure diagram III of a display substrate provided in an embodiment of the present disclosure.

Particularly, an insulating film 13, a first conductive film 15 and a second conductive film 14 are fabricated sequentially on the base substrate 11 formed with the active layer pattern 121, as shown in FIG. 5 and FIG. 7; then a photoresist 30 is applied on the base substrate 11 formed with the insulating film 13, the first conductive film 15 and the second conductive film 14, as shown in FIG. 8; then the photoresist is exposed and developed, and the second conductive film 14 is etched by a wet etching process to form a gate electrode 141, as shown in FIG. 9; subsequently, the insulating film 13 and the first conductive film 15 are etched by a dry etching process to form a gate electrode insulating pattern 131 and a conductive pattern 151, as shown in FIG. 10; and finally, the photoresist 30 on the gate electrode 141 is stripped off.

Since both the conductive pattern 151 and the gate electrode insulating pattern 131 are formed by etching with a dry etching process, it can be ensured that the orthographic projection of the conductive pattern 151 on the base substrate 11 is overlapped with the orthographic projection of the gate electrode insulating pattern 131 on the base substrate 11, that is, the conductive pattern 151 is present everywhere on the surface of the gate electrode insulating pattern 131. The conductive pattern 151 makes up for the defect of lacking gate electrode in a little distance on the edges of the gate electrode insulating pattern in the related art, such that the corresponding active layer pattern under the whole gate electrode insulating pattern can be modulated, which enhances the electrical properties of the thin film transistor, thereby improving the display effect of the display device.

Further, before forming the active layer pattern 121, the method may further comprise the following step.

Step 103: forming a buffer layer 16 on the base substrate 11, as shown in FIG. 3; wherein the buffer layer 16 is typically an inorganic film composed of a SiOx material.

After forming the gate electrode 141, the method may further comprise the following steps.

Figure 12:
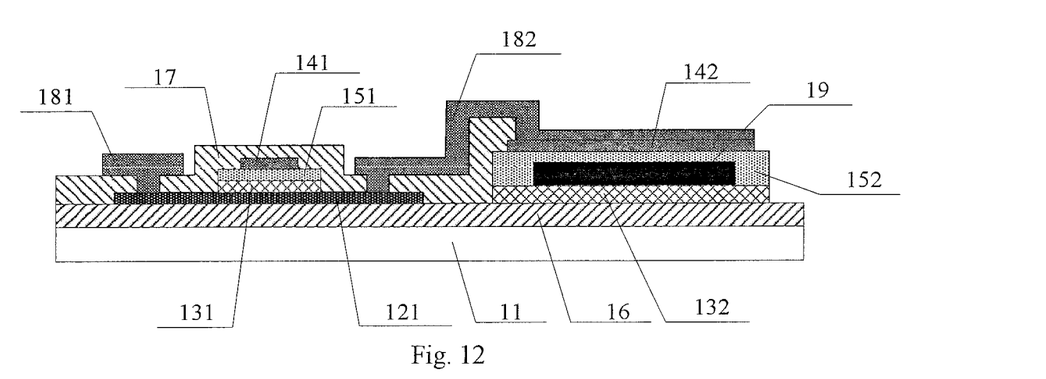
FIG. 12 is a schematic sectional structure diagram X of a display substrate provided in an embodiment of the present disclosure.

Step 104: forming an interlayer dielectric layer 17 overlaying the gate electrode 141, as shown in FIG. 12; wherein the interlayer dielectric layer 17 is also referred to as an insulating layer, typically composed of an insulating material.

Step 105: forming a source electrode 181 and a drain electrode 182 on the interlayer dielectric layer 17, the source electrode 181 and the drain electrode 182 being electrically connected to the active layer pattern 121 through via holes respectively, as shown in FIG. 12.

Yet another embodiment of the present disclosure provides a manufacturing method of a display substrate, comprising the following steps.

Step 201: forming a semiconductor layer comprising an active layer pattern 121 on a base substrate 11, as shown in FIG. 4.

In practical manufacture, a semiconductor film may be firstly fabricated on a base substrate 11, and then the semiconductor film is patterned to form a semiconductor layer comprising an active layer pattern 121, as shown in FIG. 4.

Step 202: forming an insulating layer, a first conductive layer and a second conductive layer, which are sequentially arranged in lamination, on the base substrate 11 formed with the semiconductor layer, wherein the insulating layer comprises a gate electrode insulating pattern 131 and a first insulating pattern 132, the first conductive layer comprises a conductive pattern 151 and a pixel electrode 152, and the second conductive layer comprises a gate electrode 141 and an etching-blocking and retaining pattern 142; wherein an orthographic projection of the conductive pattern 151 on the base substrate 11 is overlapped with an orthographic projection of the gate electrode insulating pattern 131 on the base substrate 11, and the gate electrode 141 is disposed on the conductive pattern 151 and is electrically connected to the conductive pattern 151.

Particularly, an insulating film 13, a first conductive film 15 and a second conductive film 14 are firstly fabricated sequentially on the base substrate 11 formed with the semiconductor layer, as shown in FIG. 5 and FIG. 7; then the insulating film 13, the first conductive film 15 and the second conductive film 14 are patterned, wherein the second conductive film 14 is etched by a wet etching process to form a gate electrode 141 and an etching-blocking and retaining pattern 142, as shown in FIG. 9, and the insulating film 13 and the first conductive film 15 are etched by a dry etching process to form a gate electrode insulating pattern 131 and a conductive pattern 151, as well as a first insulating pattern 132 and a pixel electrode 152, as shown in FIG. 10; and finally, photoresist 30 is stripped off.

Since the conductive pattern 151 and the gate electrode insulating pattern 131 are formed by etching with a dry etching process, it can be ensured that the orthographic projection of the conductive pattern 151 on the base substrate 11 is overlapped with the orthographic projection of the gate electrode insulating pattern 131 on the base substrate 11, that is, the conductive pattern 151 is present everywhere on the surface of the gate electrode insulating pattern 131. The conductive pattern 151 makes up for the defect of lacking gate electrode in a little distance on the edges of the gate electrode insulating pattern in the related art, such that the corresponding active layer pattern under the whole gate electrode insulating pattern can be modulated, which enhances the electrical properties of the thin film transistor, thereby improving the display effect of the display device.

Further, after forming the second conductive layer, the method may further comprise the following steps.

Step 203: forming an interlayer dielectric layer 17 overlaying the second conductive layer, as shown in FIG. 12; wherein the interlayer dielectric layer 17 is also referred to as an insulating layer, typically composed of an insulating material.

Step 204: forming a source electrode 181 and a drain electrode 182 on the interlayer dielectric layer 17, as shown in FIG. 12. Here, the drain electrode 182 is electrically connected to the pixel electrode 152 via the etching-blocking and retaining pattern 142.

Step 205: forming a passivating layer 20 overlaying the source electrode 181 and the drain electrode 182.

In practical manufacture, as shown in FIG. 13 to FIG. 16, when patterning the passivating layer 20, the passivating layer 20 and the etching-blocking and retaining pattern 142 may be etched by a process of first dry etching and then wet etching, to expose the pixel electrode 152.

Step 206: forming a pixel definition layer 21 on the passivating layer 20, as shown in FIG. 17.

Still another embodiment of the present disclosure provides a manufacturing method of a bottom emitting display substrate, comprising the following steps.

Step 301: forming a buffer lay 16 on a base substrate 11, as shown in FIG. 3. Here, the buffer layer 16 is typically an inorganic film composed of a SiOx material.

Step 302: forming a semiconductor layer comprising an active layer pattern 121 on the buffer layer 16, as shown in FIG. 4.

In practical manufacture, a semiconductor film may be firstly fabricated on the base substrate, and then the semiconductor film is patterned to form a semiconductor layer comprising an active layer pattern 121, as shown in FIG. 4.

Step 303: forming an insulating film 13 overlaying the semiconductor layer, as shown in FIG. 5.

Figure 6:
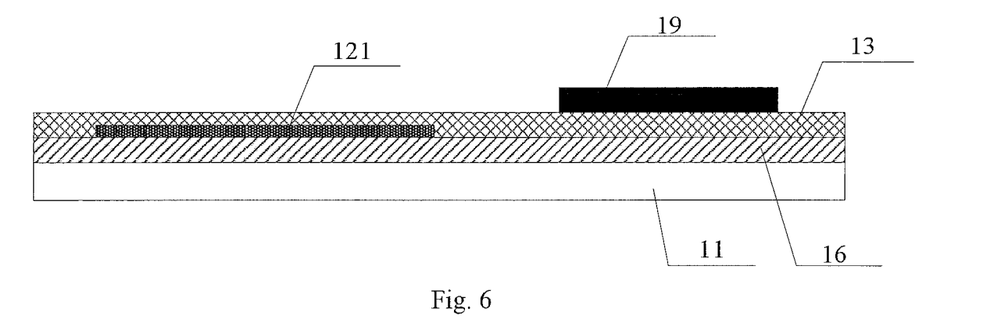
FIG. 6 is a schematic sectional structure diagram IV of a display substrate provided in an embodiment of the present disclosure.

Step 304: forming a color film 19 in a pixel region of the base substrate 11 formed with the insulating film 13, as shown in FIG. 6. Here, the color film 19 is typically fabricated by a COA process.

Step 305: sequentially forming a first conductive film 15 and a second conductive film 14 arranged in lamination overlaying the color film 19, as shown in FIG. 7.

Step 306: patterning the second conductive film 14, the first conductive film 15 and the insulating film 13 to form an insulating layer, a first conductive layer and a second conductive layer, which are sequentially arranged in lamination, wherein the insulating layer comprises a gate electrode insulating pattern 131 and a first insulating pattern 132, the first conductive layer comprises a conductive pattern 151 and a pixel electrode 152, and the second conductive layer comprises a gate electrode 141 and an etching-blocking and retaining pattern 142; wherein an orthographic projection of the conductive pattern 151 on the base substrate 11 is overlapped with an orthographic projection of the gate electrode insulating pattern 131 on the base substrate 11, and the gate electrode 141 is disposed on the conductive pattern 151 and is electrically connected to the conductive pattern 151.

Particularly, a photoresist 30 is applied on the base substrate 11 formed with the insulating film 13, the first conductive film 15 and the second conductive film 14, as shown in FIG. 8; then the photoresist is exposed and developed, and the second conductive film 14 is etched by a wet etching process to form a second conductive layer comprising a gate electrode 141 and an etching-blocking and retaining pattern 142, as shown in FIG. 9; subsequently, the insulating film 13 and the first conductive film 15 are etched by a dry etching process to form a first conductive layer and an insulating layer, wherein the insulating layer comprises a gate electrode insulating pattern 131 and a first insulating pattern 132, and the first conductive layer comprises a conductive pattern 151 and a pixel electrode 152, as shown in FIG. 10; and finally, the photoresist 30 on the second conductive layer is stripped off, as shown in FIG. 11. Since the conductive pattern 151 and the gate electrode insulating pattern 131 are formed by etching with a dry etching process, it can be ensured that an orthographic projection of the conductive pattern 151 on the base substrate 11 is overlapped with an orthographic projection of the gate electrode insulating pattern 131 on the base substrate 11.

Step 307: forming an interlayer dielectric layer 17 overlaying the second conductive layer, as shown in FIG. 12; wherein the interlayer dielectric layer 17 is also referred to as an insulating layer, typically composed of an insulating material.

Step 308: forming a source electrode 181 and a drain electrode 182 on the interlayer dielectric layer 17, as shown in FIG. 12. Here, the drain electrode 182 is electrically connected to the pixel electrode 152 via the etching-blocking and retaining pattern 142.

Step 309: forming a passivating layer 20 overlaying the source electrode 181 and the drain electrode 182.

Figure 16:
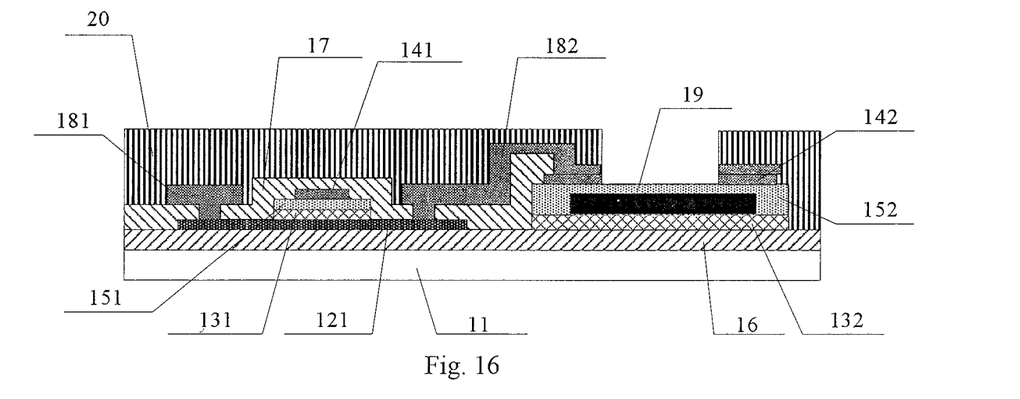
FIG. 16 is a schematic sectional structure diagram XIV of a display substrate provided in an embodiment of the present disclosure.

Particularly, when patterning the passivating layer 20, a photoresist 30 is firstly applied, as shown in FIG. 13; then the photoresist is exposed and developed, and subsequently, the passivating layer 20 is etched by a dry etching process, as shown in FIG. 14; and then the drain electrode 182 and the etching-blocking and retaining pattern 142 are etched by a wet etching process, as shown in FIG. 15, to expose the pixel electrode 152; finally, the photoresist 30 is stripped off, as shown in FIG. 16.

Step 310: forming a pixel definition layer 21 on the passivating layer 20, as shown in FIG. 17.

In the embodiments of the present disclosure, since the conductive pattern 151 and the gate electrode insulating pattern 131 are formed by etching with a dry etching process, it can be ensured that the orthographic projection of the conductive pattern 151 on the base substrate 11 is overlapped with the orthographic projection of the gate electrode insulating pattern 131 on the base substrate 11, that is, the conductive pattern 151 is present everywhere on the surface of the gate electrode insulating pattern 131. The conductive pattern 151 makes up for the defect of lacking gate electrode in a little distance on the edges of the gate electrode insulating pattern in the related art, such that the corresponding active layer pattern under the whole gate electrode insulating pattern can be modulated, which enhances the electrical properties of the thin film transistor, thereby improving the display effect of the display device.

In the thin film transistor and the manufacturing method thereof, the display substrate and the manufacturing method thereof, and the display device provided according to the embodiments of the present disclosure, the thin film transistor comprises a base substrate, an active layer pattern disposed on the base substrate, a gate electrode insulating pattern disposed on the active layer pattern, and a gate electrode disposed on the gate electrode insulating pattern, wherein a conductive pattern is provided between the gate electrode and the gate electrode insulating pattern, the conductive pattern being electrically connected to the gate electrode, and an orthographic projection of the conductive pattern on the base substrate being overlapped with an orthographic projection of the gate electrode insulating pattern on the base substrate. As compared to the related art, the thin film transistor provided in the embodiments of the present disclosure comprises a conductive pattern disposed between the gate electrode and the gate electrode insulating pattern, and thus, since the gate electrode can be firstly formed by etching with a wet etching process, and then the conductive pattern and the gate electrode insulating pattern can be formed by etching with a dry etching process, it can be ensured that the orthographic projection of the conductive pattern on the base substrate is overlapped with the orthographic projection of the gate electrode insulating pattern on the base substrate, that is, the conductive pattern is present everywhere on the surface of the gate electrode insulating pattern. The conductive pattern makes up for the defect of lacking gate electrode in a little distance on the edges of the gate electrode insulating pattern in the related art, such that the corresponding active layer pattern under the whole gate electrode insulating pattern can be modulated, which enhances the electrical properties of the thin film transistor, thereby improving the display effect of the display device.

The above descriptions are only some particular embodiments of the present disclosure, but the protection scope of the present application is not limited thereto. Within the technical scope disclosed in the present application, one skilled in the art can readily envisage variations and alternatives, and all of them are covered by the protection scope of the present application. Therefore, the protection scope of the present application should be determined by the appended claims.

What is claimed is:

1. A thin film transistor, comprising:
a base substrate;
an active layer pattern disposed on the base substrate;
a gate electrode insulating pattern disposed on the active layer pattern; and
a gate electrode disposed on the gate electrode insulating pattern; said thin film transistor further comprising:
a conductive pattern disposed between the gate electrode and the gate electrode insulating pattern,
wherein, the conductive pattern is electrically connected to the gate electrode, and an orthographic projection of the conductive pattern on the base substrate is completely overlapped with an orthographic projection of the gate electrode insulating pattern on the base substrate, and
wherein an orthographic projection of the gate electrode on a base substrate is not completely overlapped with the orthographic projection of the conductive pattern on the base substrate.

2. The thin film transistor according to claim 1, wherein the conductive pattern comprises a non-metallic conductive material.

3. The thin film transistor according to claim 2, wherein the conductive pattern comprises a graphene material or carbon nanotubes.

4. The thin film transistor according to claim 1, wherein the thin film transistor further comprises a buffer layer disposed between the base substrate and the active layer pattern.

5. The thin film transistor according to claim 1, wherein the thin film transistor further comprises an interlayer dielectric layer overlaying the gate electrode, and a source electrode and a drain electrode disposed on the interlayer dielectric layer, wherein the source electrode and the drain electrode are electrically connected to the active layer pattern through via holes respectively.

6. A display substrate comprising the thin film transistor according to claim 1.

7. The display substrate according to claim 6, wherein the display substrate further comprises a pixel electrode, wherein the pixel electrode is disposed in the same layer and made from the same material as the conductive pattern; and
the pixel electrode is electrically connected to a drain electrode of the thin film transistor.

8. The display substrate according to claim 7, wherein the display substrate further comprises a first insulating pattern disposed in the same layer as the gate electrode insulating pattern.

9. The display substrate according to claim 8, wherein the display substrate further comprises a color film disposed between the first insulating pattern and the pixel electrode.

10. The display substrate according to claim 7, wherein the display substrate further comprises an etching-blocking and retaining pattern,
wherein the etching-blocking and retaining pattern is disposed in the same layer and made from the same material as the gate electrode.

11. The display substrate according to claim 10, wherein the display substrate further comprises a passivating layer overlaying the thin film transistor and a pixel definition layer disposed on the passivating layer.

12. A display device comprising the display substrate according to claim 6.

13. A manufacturing method of a thin film transistor, comprising:
  forming an active layer pattern on a base substrate; and
  forming a gate electrode insulating pattern, a conductive pattern and a gate electrode, which are sequentially arranged in lamination, on a side of the base substrate on which the active layer pattern is formed,
  wherein an orthographic projection of the conductive pattern on the base substrate is completely overlapped with an orthographic projection of the gate electrode insulating pattern on the base substrate, and the gate electrode is disposed on the conductive pattern and is electrically connected to the conductive pattern, and
  wherein an orthographic projection of the gate electrode on the base substrate is not completely overlapped with the orthographic projection of the conductive pattern on the base substrate.

14. The manufacturing method according to claim 13, wherein said forming the gate electrode insulating pattern, the conductive pattern and the gate electrode, which are sequentially arranged in lamination, comprising:
  fabricating an insulating film, a first conductive film and a second conductive film sequentially on a side of the base substrate on which the active layer pattern is formed;
  etching the second conductive film by a wet etching process to form the gate electrode; and
  etching the insulating film and the first conductive film by a dry etching process to form the gate electrode insulating pattern and the conductive pattern.

15. The manufacturing method according to claim 13, wherein, before forming the active layer pattern, the method further comprises:
  forming a buffer layer on the base substrate.

16. The manufacturing method according to claim 13, wherein, after forming the gate electrode, the method further comprises:
  forming an interlayer dielectric layer overlaying the gate electrode; and
  forming a source electrode and a drain electrode on the interlayer dielectric layer, the source electrode and the drain electrode being electrically connected to the active layer pattern through via holes respectively.

17. A manufacturing method of a display substrate, comprising:
  forming a semiconductor layer on a base substrate, the semiconductor layer comprising an active layer pattern; and
  forming an insulating layer, a first conductive layer and a second conductive layer, which are sequentially arranged in lamination, on a side of the base substrate on which the semiconductor layer is formed,
  wherein the insulating layer comprises a gate electrode insulating pattern and a first insulating pattern, the first conductive layer comprises a conductive pattern and a pixel electrode, and the second conductive layer comprises a gate electrode and an etching-blocking and retaining pattern, wherein an orthographic projection of the conductive pattern on the base substrate is completely overlapped with an orthographic projection of the gate electrode insulating pattern on the base substrate, and the gate electrode is disposed on the conductive pattern and is electrically connected to the conductive pattern, and wherein an orthographic projection of the gate electrode on the base substrate is not completely overlapped with the orthographic projection of the conductive pattern on the base substrate.

18. The manufacturing method according to claim 17, wherein, after forming the second conductive layer, the method further comprises:
  forming an interlayer dielectric layer overlaying the second conductive layer;
  forming a source electrode and a drain electrode on the interlayer dielectric layer;
  forming a passivating layer overlaying the source electrode and the drain electrode; and
  forming a pixel definition layer on the passivating layer.

* * * * *